United States Patent
Amorim

(10) Patent No.: US 6,929,406 B2
(45) Date of Patent: Aug. 16, 2005

(54) OPTICAL DEVICE MODULE

(75) Inventor: Goncalo Agra Amorim, Ipswich (GB)

(73) Assignee: Agilent Technologies, Inc., Palo Alto, CA (US)

(*) Notice: Subject to any disclaimer, the term of this patent is extended or adjusted under 35 U.S.C. 154(b) by 28 days.

(21) Appl. No.: 10/355,869

(22) Filed: Jan. 31, 2003

(65) Prior Publication Data

US 2003/0169982 A1 Sep. 11, 2003

(30) Foreign Application Priority Data

Mar. 9, 2002 (EP) .............................................. 02251685

(51) Int. Cl.[7] ................................................ G02B 6/42
(52) U.S. Cl. ......................................... 385/92; 385/134
(58) Field of Search ........................ 385/56, 60, 76–78, 385/134–139, 92, 93–94, 58

(56) References Cited

U.S. PATENT DOCUMENTS

| | | | |
|---|---|---|---|
| 5,767,999 A | 6/1998 | Kayner ........................ | 359/163 |
| 6,062,893 A | 5/2000 | Miskin et al. ............... | 439/374 |
| 6,085,006 A | 7/2000 | Gaio et al. ..................... | 385/92 |
| 6,349,164 B1 * | 2/2002 | Mair et al. .................. | 385/134 |
| 2002/0012503 A1 | 1/2002 | Kuhne .......................... | 385/70 |

FOREIGN PATENT DOCUMENTS

| | | |
|---|---|---|
| EP | 0 448 989 | 10/1991 |
| WO | WO 98/52080 | 11/1998 |

OTHER PUBLICATIONS

Faderl, I., Examiner. European Search Report, Application No. EP 02 25 1685. dated Aug. 9, 2002.

* cited by examiner

Primary Examiner—Frank G. Font
Assistant Examiner—Michael P. Mooney

(57) ABSTRACT

An optical device module for housing optical transmitters and receivers. Preferably, the module is designed to enable optical devices to be easily inserted into and removed from modular equipment racks. The module comprises a case for housing an optical device and a plastic panel having an aperture for receiving an optical connector, in which the plastic panel has been coated with a metal coating and is connected to the case so that the optical device is substantially enclosed.

12 Claims, 6 Drawing Sheets

OPTICAL DEVICE MODULE

FIELD OF THE INVENTION

This invention relates to an optical device module for housing optical transmitters and receivers. Preferably the module is designed to enable optical devices to be easily inserted into and removed from modular equipment racks.

DISCUSSION OF THE BACKGROUND ART

Conventionally, optical devices have not been designed for use in modular systems. Therefore such optical devices are housed in a conventional manner in a housing which is designed to remain in one location, and which provides suitable electromagnetic shielding to prevent emissions from an optical device interfering with external devices and equipment.

However, a requirement for flexible modular optical equipment introduces a requirement for an optical device module which provides the required electromagnetic shielding capability for modules which may be inserted and removed from modular equipment racks. Since during normal operation the modules may reach temperatures of up to 85 degrees centigrade, the module should provide adequate thermal insulation as well as electromagnetic shielding so that modules may be inserted and removed without powering down the equipment rack, and waiting for the module to be removed to cool down.

It will be appreciated that the above requirements are conflicting because electromagnetic shielding is usually provided using a material which is electrically conductive, which in general, means that the material is also thermally conductive. So the required thermal insulation will not be achieved.

SUMMARY OF THE INVENTION

According to the present invention there is provided an optical device module comprising a case for housing an optical device and a plastic flange having means for receiving an optical connector, in which the plastic flange has been coated with a metal coating and is connected to the case so that the optical device is substantially enclosed.

Electromagnetic emission may be reduced further if the module further comprises an electromagnetic shielding gasket arranged between the case and the flange. Preferably the gasket is compressed between the flange and a panel of a modular equipment rack when the module is received by the modular equipment rack.

In one embodiment the flange is connected to the case by means of a snap fitting and in a second embodiment the flange is connected to the case by means of a screw.

For improved heat dissipation, preferably the case is fabricated from metal and has fins for heat dissipation.

In a preferred embodiment the metal coating comprises a layer of copper coated with a layer of nickel.

BRIEF DESCRIPTION OF THE DRAWINGS

Embodiments of the invention will now be described, by way of example only, with reference to the accompanying drawings, in which.

DETAILED DESCRIPTION OF THE PREFERRED EMBODIMENTS

Figure 1:
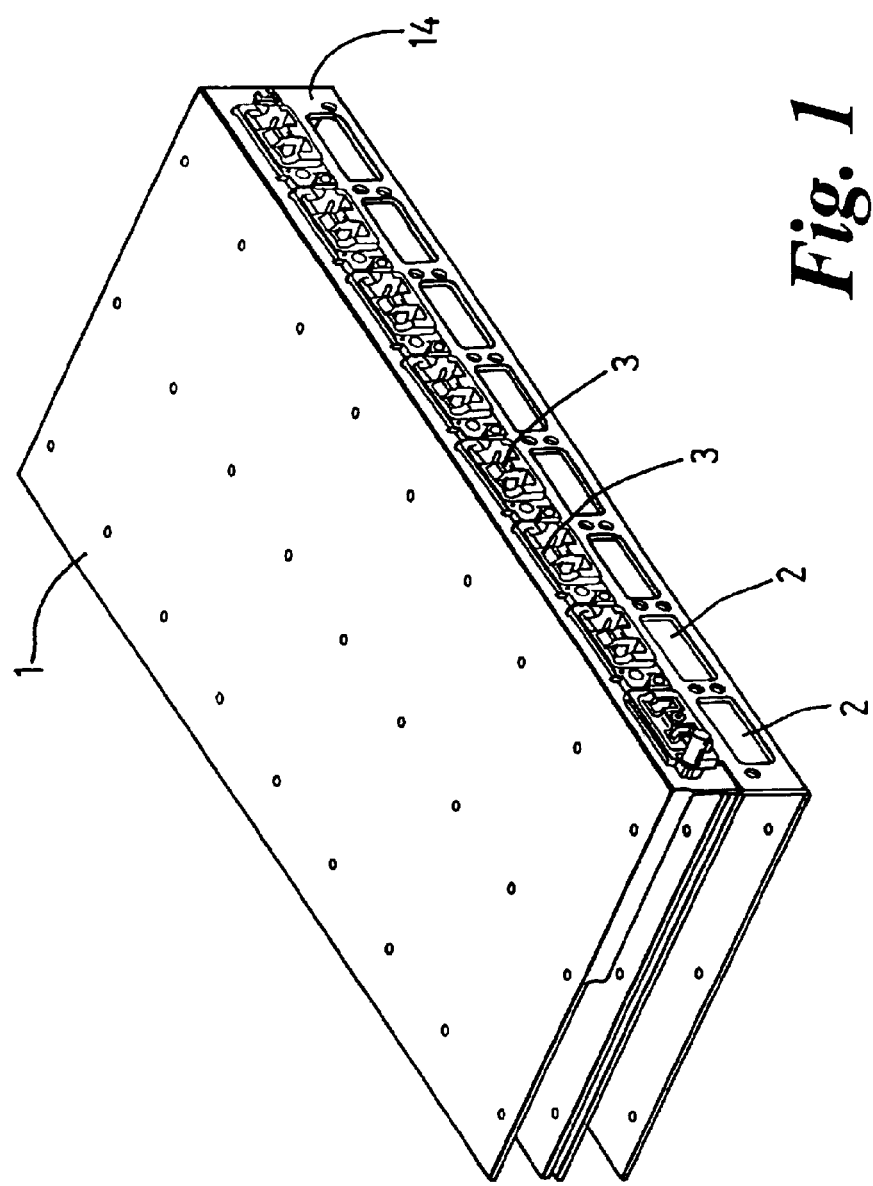
FIG. 1 illustrates a modular optical equipment rack.

Referring now to FIG. 1, a modular optical equipment rack 1 comprises a plurality of apertures 2 in a front panel 14 for receiving optical modules 3. These optical modules 3 may be modules containing one or more optical devices such as optical transmitters and receivers.

An optical transmitter receives an electrical signal via an electrical connector at the rear of the module within the modular equipment rack 1 and converts the electrical signal into an optical digital signal which is then transmitted via a light source to an optical fibre which is connected to the module 3 via an optical connector inserted into an aperture in the module 3.

An optical receiver receives an optical signal from an optical fibre connected to the module 3 via an optical connector inserted into an aperture in the module 3. The optical signal is received via a light sensitive element and converted into an electrical signal which is then sent via an electrical connector at the rear of the module 3 within the modular equipment rack 1 to electrical devices as required.

A module 3 often contains an optical transmitter and an optical receiver to form a transceiver pair.

In general the means for receiving the optical connector is provided by an aperture in the front face of the module, however the optical connector may be received by any conveniently shaped space in the module housing.

Use of a modular optical equipment rack as described above allows a customer to have much more flexibility than use of non modular system; the customer can have as many or as few optical transmitters or receivers as required. Furthermore, the equipment can start with a few modules, and more modules may be added, as more capacity is required.

In optical devices the frequency of the signal may be up to 40 GHz. In non modular systems shielding the devices so that they do not generate electromagnetic interference (EMI) is conventionally done by housing the components in a metal box so that the devices are shielded. However a more complex housing is now required, as the module has to be manufactured to slot into to a modular equipment rack 1 and furthermore must be removable at high temperatures generated during operation of the devices housed within.

Figure 2:
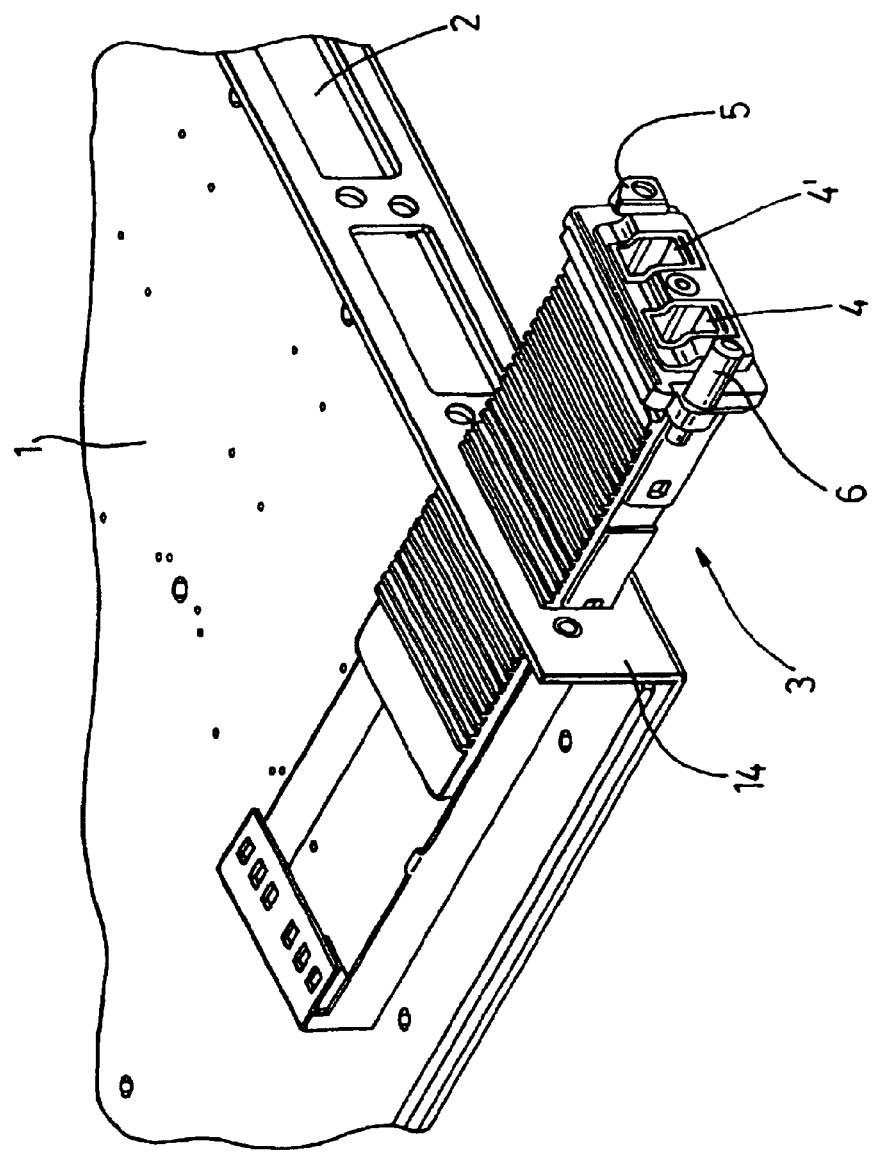
FIG. 2 illustrates the modular optical equipment rack of FIG. 1 with an optical module partially inserted.

FIG. 2 illustrates a view of a module 3 according to the invention which is partially inserted into a modular equipment rack 1. The module 3 has two apertures 4, 4' in a front panel 5 which is referred to as a flange in the following description. The flange 5 receives an optical connector for a transmitter and an optical connector for a receiver housed in the module 3. The module 3 is attached to the modular equipment rack 1 using a pair of thumbscrews, of which one thumbscrew 6 in shown.

Figure 3:
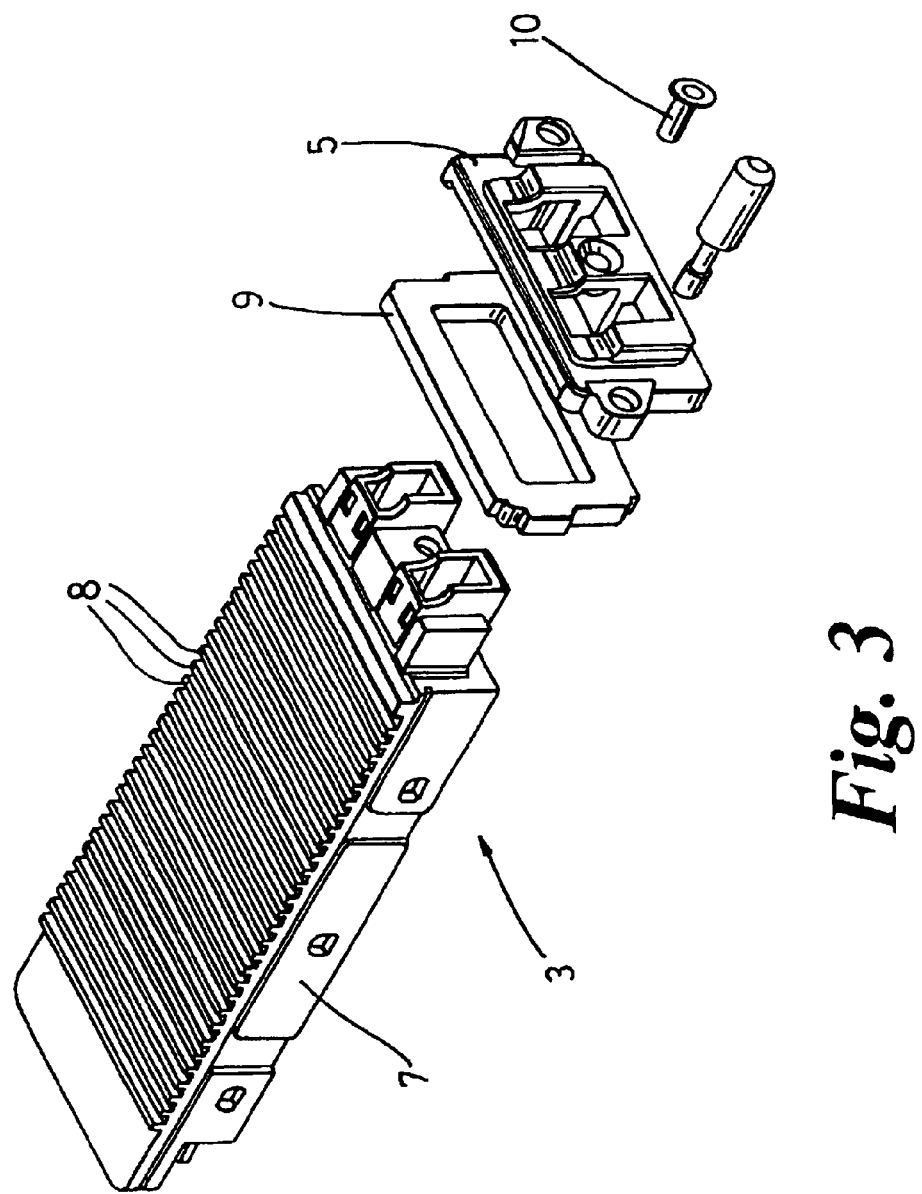
FIG. 3 illustrates a first embodiment of an optical module.

FIG. 3 is a more detailed view of a module 3 according to the invention. A metal case 7 houses an optical transmitter and an optical receiver. The metal case 7 has a plurality of fins 8 disposed along the top of the case to aid heat dissipation. It can be seen that the flange 5 is a fairly complex shape, and is manufactured from a plastic material, which allows more flexibility in design than a metal material. A plastic flange may incorporate more intricate features and the tolerances for manufacturing using plastic may be much finer. Using plastic also reduces manufacturing cost as the tooling costs are much lower.

The plastic flange is not thermally conductive so it is possible to remove and insert optical modules from the modular equipment rack without having to power down the equipment, as the front panel is thermally insulated from the case housing the optical devices.

In order for the module to have the required EMI shielding the flange 5 is metalised, using a conventional process. The plastic flange is dipped into acid, which forms micro cavities on the surface of the plastic to allow for adhesion of electroless copper to the surface. Then electrolytic nickel is deposited onto the copper using a conventional electroplating process. For sufficient EMI shielding it has been found that a metal coating comprising 1–3 mm copper and 0.5 mm nickel is sufficient, although thicker or further layers could optionally be applied. The thickness of the coating is such that the flange does not become excessively thermally conductive. Other metals which may be used include chrome or gold amongst others.

Referring still to FIG. 3, there is shown an EMI gasket 9. When devices operate at high frequency (i.e. the wavelength is small) then any slots or gaps in the module will cause the EMI shielding to be reduced. The EMI gasket 7 helps to alleviate this problem by providing a conductive medium to provide a continuous low impedance joint between the flange 5 and the casing 7. The EMI gasket may be manufactured from a conductive elastomer.

In the embodiment of the invention shown in FIGS. 2 and 3 the gasket 9 is compressed between the flange 5 and the front panel 14 by means of the thumbscrews.

Figure 4:
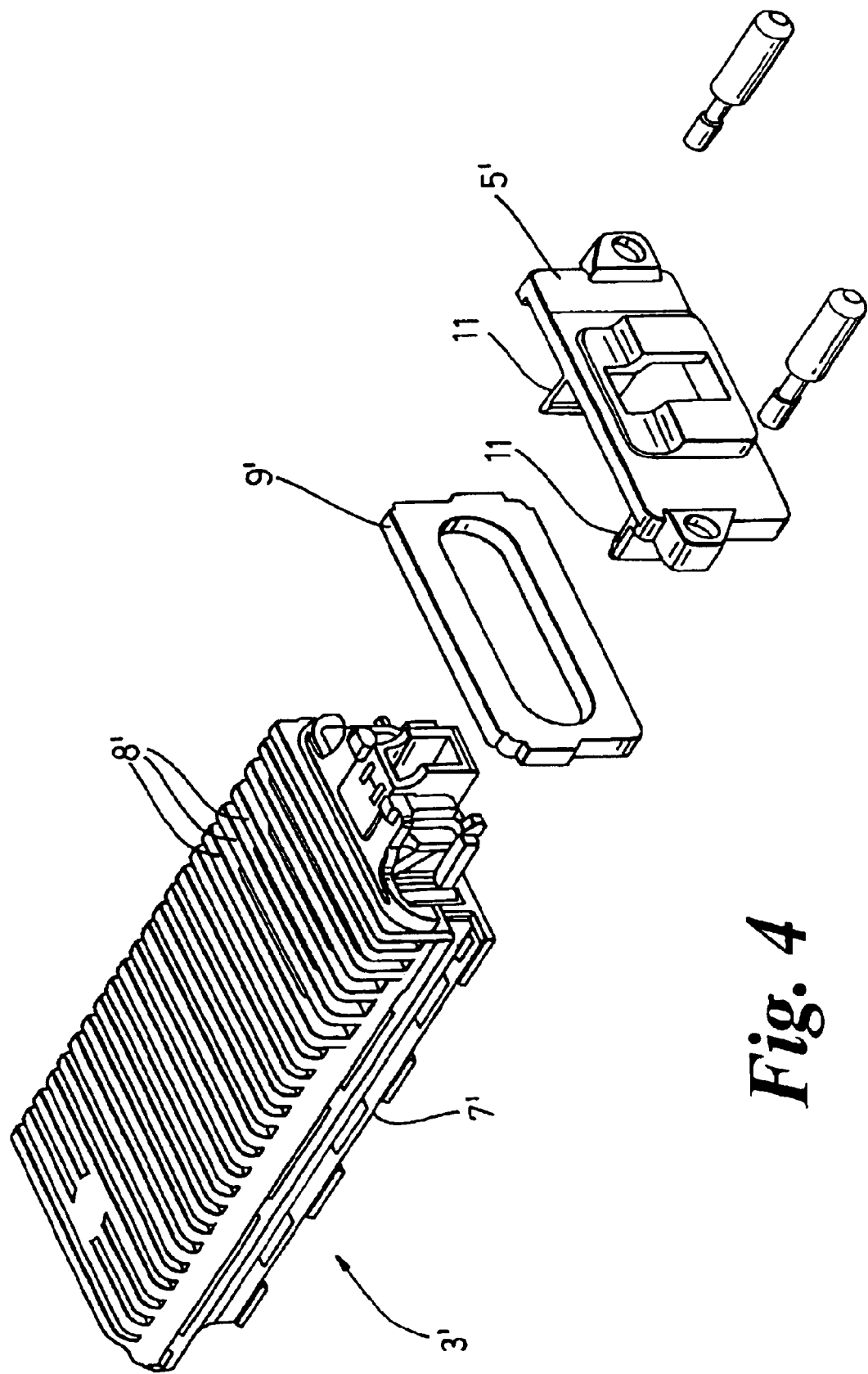
FIG. 4 illustrates a second embodiment of an optical module.
Figure 5:
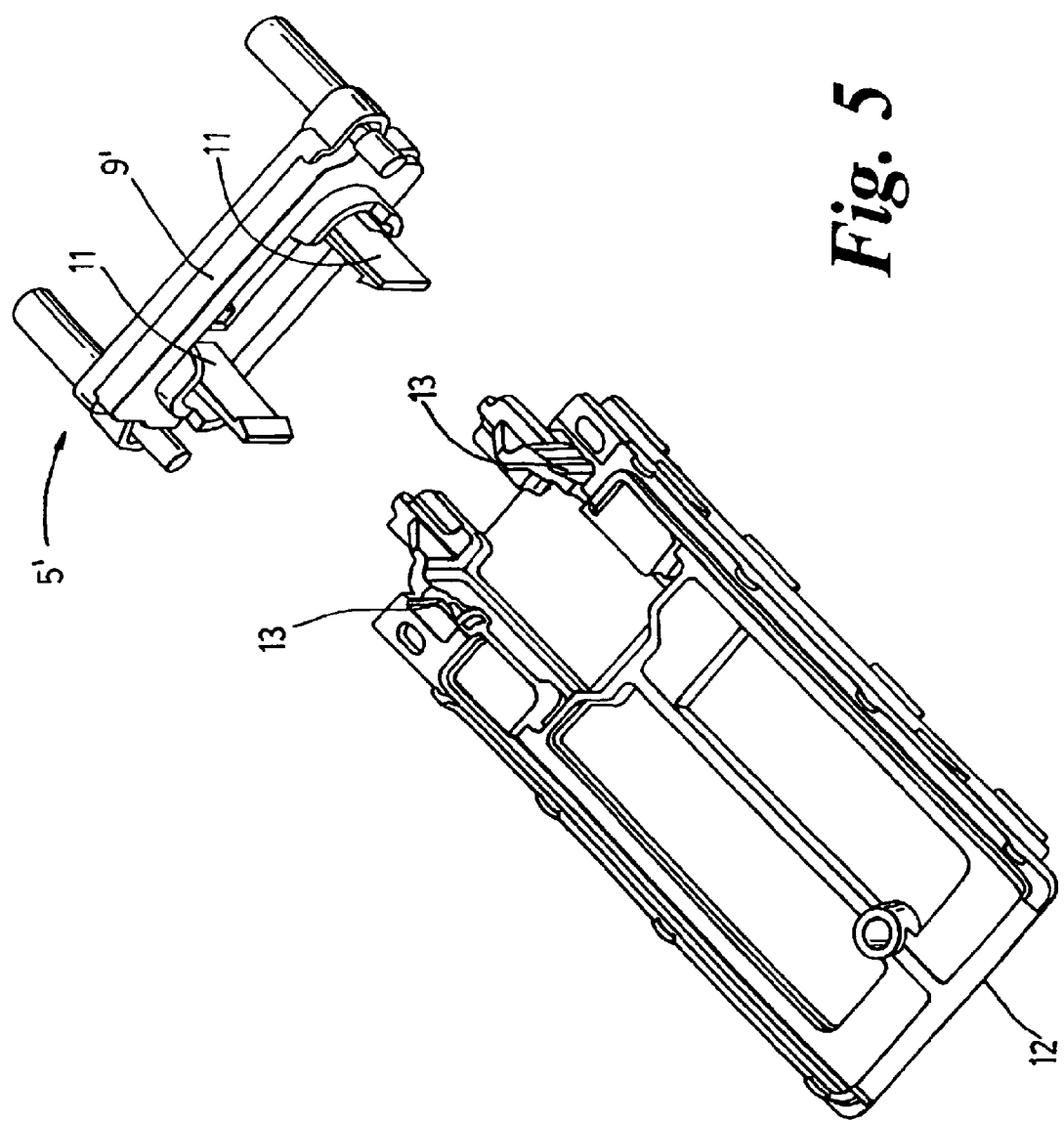
FIG. 5 illustrates a view of part of the embodiment illustrated in FIG. 4.
Figure 6:
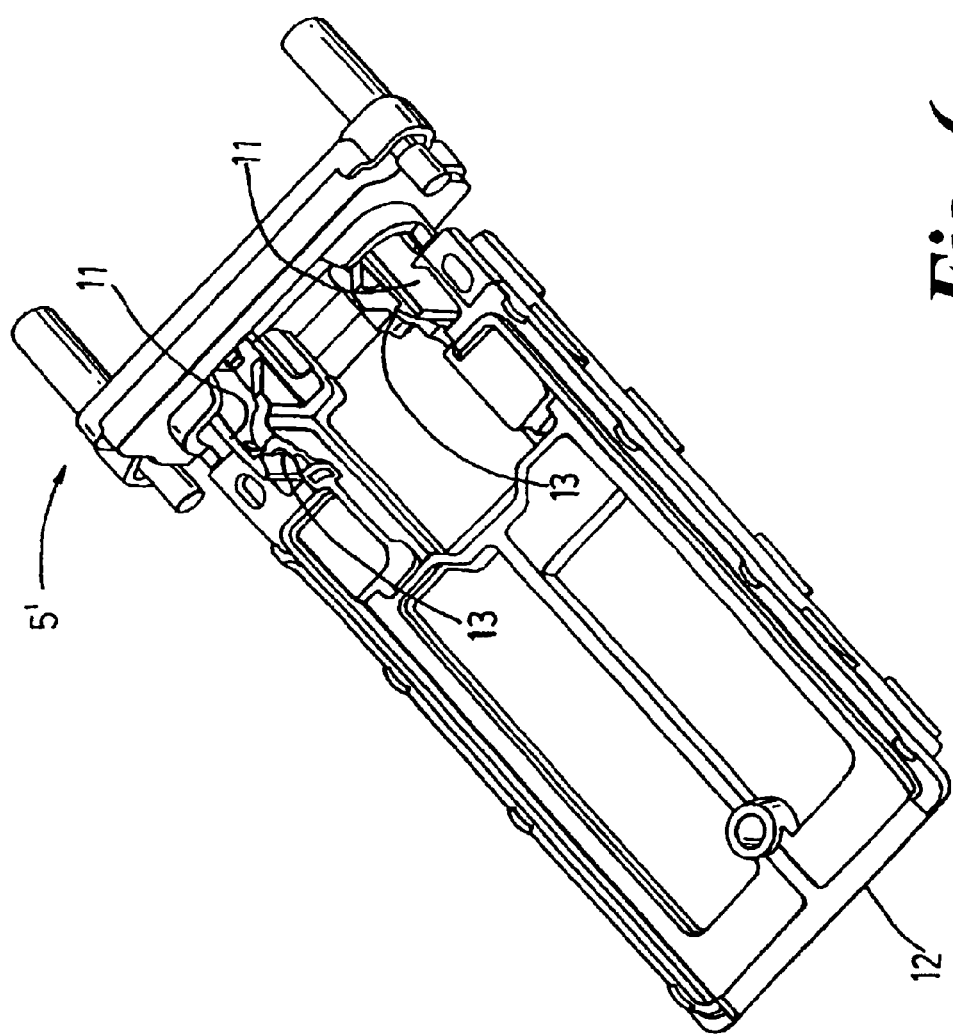
FIG. 6 illustrates a second configuration of parts illustrated in FIG. 4.

A second embodiment of the invention is illustrated in FIGS. 4, 5 and 6, in which similar parts are labelled with similar numerals marked with a prime.

Referring now to FIG. 4, an optical module 3' comprises a case 7' having a plurality of fins 8' for housing an optical transmitter. A flange 5' fabricated from a metalised plastic as described above is connected to the case 7' via an EMI gasket 9'. Hooked legs 11 protruding from the flange 5' are used to secure the flange 5' to the case 7'.

FIG. 5 is a perspective view from the top of the module illustrated in FIG. 4 in which the top of the case 7' has been removed to show a bottom part 12 of the case 7'. Here corresponding hooks 13 are shown which locate the hooked legs 11 when the flange 5' and the case 7' are pushed together, this forming a snap fit which serves to compress the gasket 9'. This embodiment illustrates another advantage of the plastic flange, as it is much simpler to fabricate the flexible hooked legs 11 from a plastic material rather than a metal based one.

FIG. 6 illustrates the module of FIG. 5 when assembled, again with a top part of the case 7' removed in order to view the bottom part 12.

Provision of a detachable flange 5' provides a further advantage for the manufacturer because the same case 7' may be provided to customers who require a modular system as described above, and to customers who require a conventional non-modular system with fixed components.

What is claimed is:

1. An optical device module comprising:
a case for housing an optical device; and
a plastic flange having means for receiving an optical connector, wherein said plastic flange has been coated with a metal coating and is connected to said case so that said optical device is substantially enclosed, and wherein said flange is connected to said case by a snap fitting device.

2. A module according to claim 1, further comprising an electromagnetic shielding gasket arranged between said case and said flange.

3. A module according to claim 2, wherein said gasket is compressed between said case and a panel of a modular equipment rack when said module is received by said modular equipment rack.

4. An optical device module comprising:
a case for housing an optical device; and
a plastic flange having means for receiving an optical connector, wherein said plastic flange has been coated with a metal coating and is connected to said case so that said optical device is substantially enclosed, and wherein said flange is connected to said case by a screw.

5. An optical device module comprising:
a case for housing an optical device; and
a plastic flange having means for receiving an optical connector, wherein said plastic flange has been coated with a metal coating and is connected to said case so that said optical device is substantially enclosed, and wherein said case is fabricated from metal and includes fins for heat dissipation.

6. An optical device module comprising:
a case for housing an optical device; and
a plastic flange having means for receiving an optical connector, wherein said plastic flange has been coated with a metal coating and is connected to said case so that said optical device is substantially enclosed, and wherein said metal coating comprises a layer of copper coated with a layer of nickel.

7. A module according to claim 4, further comprising an electromagnetic shielding gasket arranged between said case and said flange.

8. A module according to claim 7, wherein said gasket is compressed between said case and a panel of a modular equipment rack when said module is received by said modular equipment rack.

9. A module according to claim 5, further comprising an electromagnetic shielding gasket arranged between said case and said flange.

10. A module according to claim 9, wherein said gasket is compressed between said case and a panel of a modular equipment rack when said module is received by said modular equipment rack.

11. A module according to claim 6, further comprising an electromagnetic shielding gasket arranged between said case and said flange.

12. A module according to claim 11, wherein said gasket is compressed between said case and a panel of a modular equipment rack when said module is received by said modular equipment rack.

* * * * *